United States Patent
Yazaki et al.

(10) Patent No.: US 10,869,382 B2
(45) Date of Patent: *Dec. 15, 2020

(54) INTERPOSER AND ELECTRONIC APPARATUS

(71) Applicant: Murata Manufacturing Co., Ltd., Kyoto-fu (JP)

(72) Inventors: Hirokazu Yazaki, Nagaokakyo (JP); Keito Yonemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/793,040

(22) Filed: Feb. 18, 2020

(65) Prior Publication Data

US 2020/0187346 A1    Jun. 11, 2020

Related U.S. Application Data

(63) Continuation of application No. 16/525,692, filed on Jul. 30, 2019, now Pat. No. 10,616,991, which is a continuation of application No. PCT/JP2018/000734, filed on Jan. 13, 2018.

(30) Foreign Application Priority Data

Feb. 3, 2017    (JP) .................................. 2017-019065

(51) Int. Cl.
*H05K 1/02*    (2006.01)
*H05K 1/14*    (2006.01)
*H05K 7/14*    (2006.01)
*H05K 3/46*    (2006.01)

(52) U.S. Cl.
CPC ............. *H05K 1/0201* (2013.01); *H05K 1/14* (2013.01); *H05K 7/14* (2013.01); *H05K 3/46* (2013.01)

(58) Field of Classification Search
CPC .......... H05K 1/0201; H05K 1/14; H05K 7/14; H05K 3/46
USPC ....................................................... 174/250
See application file for complete search history.

(56) References Cited

PUBLICATIONS

Yazaki et al., "Interposer and Electronic Apparatus", U.S. Appl. No. 16/525,692, filed Jul. 30, 2019.

*Primary Examiner* — Tremesha S Willis
(74) *Attorney, Agent, or Firm* — Keating & Bennett, LLP

(57) ABSTRACT

An interposer includes an insulating element body, a wiring electrode inside the element body, a signal terminal electrode at the top surface of the element body and connected to a flat cable with a conductive bonding material interposed therebetween, and a ground terminal electrode. A through-hole penetrates through the element body to allow a bar-shaped metal fixing member to be inserted. A metal fixing member connecting electrode to be electrically connected to a metal fixing member is provided at at least one of the top surface of the element body and an inner wall of the through-hole. Predetermined signal terminal electrodes are electrically connected by the wiring electrode. The ground terminal electrode and the metal fixing member connecting electrode are electrically connected.

12 Claims, 10 Drawing Sheets

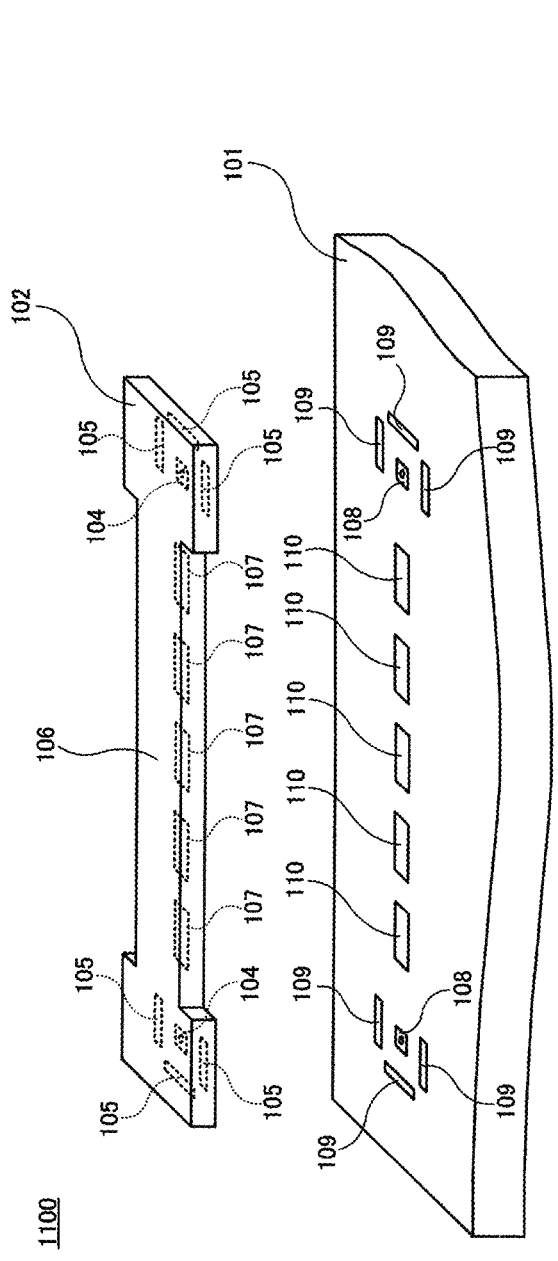
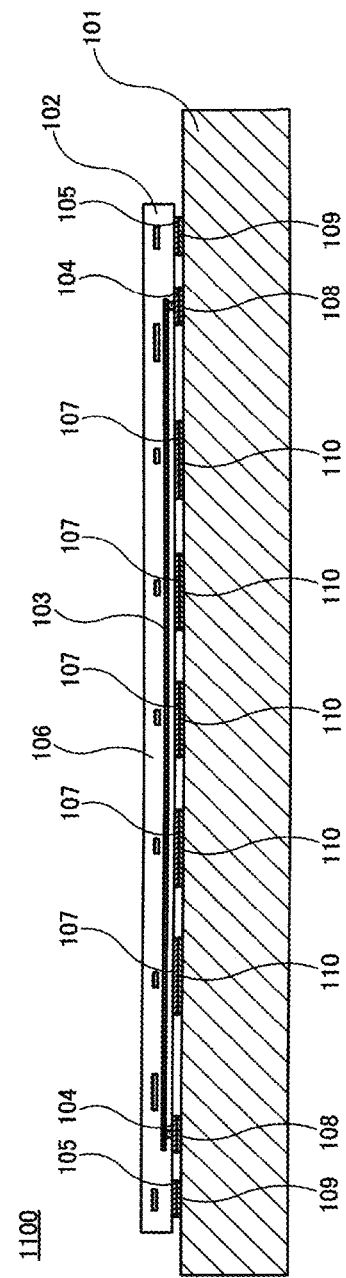
FIG. 10A
Prior Art
FIG. 10B
Prior Art

INTERPOSER AND ELECTRONIC APPARATUS

CROSS REFERENCE TO RELATED APPLICATIONS

This application claims the benefit of priority to Japanese Patent Application No. 2017-019065 filed on Feb. 3, 2017 and is a Continuation Application of PCT Application No. PCT/JP2018/000734 filed on Jan. 13, 2018. The entire contents of each application are hereby incorporated herein by reference.

BACKGROUND OF THE INVENTION

1. Field of the Invention

The present invention relates to interposers, and more particularly, to an interposer that enables a ground line to be easily grounded to a case made of metal or the like.

The present invention also relates to electronic apparatuses including an interposer, and more particularly, to an electronic apparatus in which a ground potential of a ground line is stable.

2. Description of the Related Art

In an electronic apparatus, such as a smartphone, electrical connection between points spaced away from each other may be performed using a connecting element, such as a flat cable.

An electronic apparatus that performs electrical connection using a flat cable is disclosed in WO 2016/088592 A1. FIGS. 10A and 10B illustrate an electronic apparatus 1100 disclosed in WO 2016/088592 A1. FIG. 10A is a principal portion exploded perspective view of the electronic apparatus 1100, where a circuit substrate 101 and a flat cable 102 are illustrated separately. FIG. 10B is a principal portion cross-sectional view of the electronic apparatus 1100.

In the electronic apparatus 1100, the flat cable (electric element) 102 is mounted at the circuit substrate (substrate) 101.

The flat cable 102 has a long shape, and a signal line (signal conductor pattern) 103 and a ground line (ground conductor pattern; not illustrated in the drawing) are provided inside the flat cable 102.

Signal terminal electrodes (connection end portions of the signal conductor pattern) 104 to which end portions of the signal line 103 are connected are provided at both ends of the flat cable 102.

Furthermore, ground terminal electrodes (ground conductor patterns partially exposed out of a protection film) 105 to which the end portions of the ground line are connected are provided at the both ends of the flat cable 102. The ground terminal electrodes 105 each include a set of three electrodes that surround the corresponding one of the signal terminal electrodes 104 from three directions.

A plurality of intermediate ground terminal electrodes (electric-element-side bonding patterns) 107 are provided at a transmission line portion 106 of the flat cable 102. Each of the intermediate ground terminal electrodes 107 is connected to the ground line with a via-hole conductor (interlayer connecting conductor; not illustrated in the drawing) interposed therebetween.

In contrast, signal terminal electrodes (signal conductor patterns) 108 on a substrate side are provided at the circuit substrate 101 in association with the signal terminal electrodes 104 at the flat cable 102. Furthermore, ground terminal electrodes (ground conductor patterns) 109 on the substrate side are provided in association with the ground terminal electrodes 105 at the flat cable 102. Moreover, intermediate ground terminal electrodes (substrate-side bonding patterns) on the substrate side are provided in association with the intermediate ground terminal electrodes 107 at the flat cable 102.

The signal terminal electrodes 104 and the signal terminal electrodes 108, the ground terminal electrodes 105 and the ground terminal electrodes 109, and the intermediate ground terminal electrodes 107 and the intermediate ground terminal electrodes 110, are correspondingly connected by conductive bonding materials.

In the electronic apparatus 1100, the intermediate ground terminal electrodes 107 are provided to stabilize the ground potential of the ground line in the case where the transmission line portion 106 of the flat cable 102 is long. That is, in the case where the transmission line portion 106 of the flat cable 102 is long, the ground potential of an intermediate portion of the ground line may be unstable. Therefore, external noise may be superimposed on a signal flowing in the signal line 103 and the insertion loss of the signal line 103 may thus be increased. Thus, in the electronic apparatus 1100, with a configuration in which the ground line of the flat cable 102 is connected to the intermediate ground terminal electrodes 107 at a plurality of points so that the intermediate ground terminal electrodes 107 is able to be connected to the intermediate ground terminal electrodes 110 at the circuit substrate 101, the intermediate portion of the ground line of the flat cable 102 is connected (grounded) to a stable (large) ground provided at the circuit substrate 101, and the ground potential of the intermediate portion of the ground line of the flat cable 102 is thus able to be stabilized.

In the electronic apparatus 1100, the ground potential of the intermediate portion of the ground line is stable. Therefore, external noise is less likely to be superimposed on a signal flowing in the signal line 103. Furthermore, in the electronic apparatus 1100, the ground potential of the intermediate portion of the ground line is stable, and therefore, the insertion loss of the signal line 103 is low.

Recently, cases made of metal have often been used for electronic apparatuses, such as smartphones. Cases made of metal correspond to the largest and most stable grounds in such electronic apparatuses.

Therefore, it is preferable that the ground terminal electrodes 105 and the intermediate ground terminal electrodes 107 at the flat cable 102 of the electronic apparatus 1100 is directly connected (grounded) to a case made of metal. However, the electronic apparatus 1100 is designed based on the assumption that the flat cable 102 is surface-mounted at the circuit substrate. Therefore, the electronic apparatus 1100 may not be used in a state in which the flat cable 102 is attached to the case made of metal.

Furthermore, the flat cable 102 of the electronic apparatus 1100 requires a large area (region) for surface mounting at the circuit substrate, which causes a problem of increasing the size of the circuit substrate. Thus, there is a problem in that the size of the electronic apparatus 1100 itself increases as the size of the circuit substrate increases. For example, for a general flat cable not including the intermediate ground terminal electrodes 107, another electronic component may be mounted at the circuit substrate, and wiring may be provided using a space above the mounted electronic component. However, the flat cable 102 cannot be used for such wiring.

SUMMARY OF THE INVENTION

Preferred embodiments of the present invention provide interposers and electronic apparatuses that each enable a ground line to be easily connected (grounded) to a case made of metal or to a ground electrode or the like of the circuit substrate.

An interposer according to a preferred embodiment of the present invention includes insulating element bodies including a bottom surface, a top surface, and a plurality of side surfaces connecting the bottom surface with the top surface; a wiring electrode provided inside the element body; and a terminal electrode provided at the top surface of the element body and connected to an outside with a conductive bonding material interposed therebetween. The terminal electrode includes a signal terminal electrode connected to an external signal line and a ground terminal electrode connected to an external ground line. A through-hole penetrating through the bottom surface and the top surface of the element body and enabling a bar-shaped metal fixing member to be inserted therein is provided. A metal fixing member connecting electrode electrically connected to the metal fixing member is provided at at least one of the top surface of the element body and an inner wall of the through-hole. Predetermined signal terminal electrodes are electrically connected by the wiring electrode, and the ground terminal electrode and the metal fixing member connecting electrode are electrically connected.

The element body may be, for example, a rectangular or substantially parallelepiped that includes four side surfaces.

It is preferable that the element body is a multilayer element body in which insulating layers are laminated. In this case, a via-hole conductor penetrating through both main surfaces of the insulating layers and a line conductor provided between the insulating layers define the wiring electrode. With the wiring electrode, predetermined terminal electrodes are able to be connected and the ground terminal electrode may be connected to the metal fixing member connecting electrode.

The element body may be made of, for example, ceramics. In this case, an interposer with an excellent heat resistance is able to be produced.

In the case where the element body is made of ceramics, conductive resin may be filled in the through-hole, and thread grooves may be provided in the conductive resin. In this case, thread ridges may be provided in the metal fixing member, and the thread grooves may be engaged with the thread ridges. Accordingly, the metal fixing member is able to be firmly fixed to the element body.

The terminal electrode may be provided at the top surface of the element body such that a flat cable is connected to the terminal electrode. For example, the terminal electrode may be provided at the top surface of the element body such that two flat cables are connected to the terminal electrode. Alternatively, the terminal electrode may be provided such that three or more flat cables are connected to the terminal electrode.

It is preferable that a plurality of through-holes are provided in the element body. In this case, the interposer may be mounted at the case or the circuit substrate by a plurality of metal fixing members. Therefore, a problem of a mounted interposer rotating around the metal fixing member (through-hole) does not occur.

Furthermore, an electronic apparatus according to a preferred embodiment of the present invention includes a case; a circuit substrate accommodated in the case; and a signal line and a ground line, and further includes an interposer including an insulating element body including a bottom surface, a top surface, and a plurality of side surfaces connecting the bottom surface with the top surface, a wiring electrode provided inside the element body, and a terminal electrode provided at the top surface of the element body, wherein the terminal electrode includes a signal terminal electrode connected to the signal line and a ground terminal electrode connected to the ground line, a through-hole penetrates through the bottom surface and the top surface of the element body, a metal fixing member connecting electrode is provided at the top surface of the element body or an inner wall of the through-hole, predetermined signal terminal electrodes are electrically connected by the wiring electrode, and the ground terminal electrode and the metal fixing member connecting electrode are electrically connected; and a bar-shaped metal fixing member. A fixing hole to fix the metal fixing member is provided in the case or the wiring substrate. After the metal fixing member is inserted in the through-hole so that the metal fixing member is electrically connected to the metal fixing member connecting electrode, the metal fixing member is fixed to the fixing hole, and the interposer is mounted at the case or the circuit substrate. The signal line is electrically connected to the signal terminal electrode of the interposer by a conductive bonding material, and the ground line is electrically connected to the ground terminal electrode of the interposer.

The case may be made of metal. The fixing hole may be provided in the case. The metal fixing member may be electrically connected to the case. In this case, the ground line of the flat cable may be easily connected (grounded) to the case made of metal with the metal fixing member interposed therebetween.

The circuit substrate may include a ground electrode and a metal member electrically connected to the ground electrode. The fixing hole may be provided in the metal member. The metal fixing member and the ground electrode may be electrically connected with the metal member interposed therebetween. In this case, the ground line of the flat cable may be easily connected (grounded) to the ground electrode at the circuit substrate with the interposer and the metal fixing member interposed therebetween.

Thread ridges may be provided at at least a tip of the metal fixing member. Thread grooves may be provided at an inner wall of the fixing hole. The metal fixing member may be fixed to the fixing hole by causing the thread ridges to be engaged with the thread grooves. In this case, the metal fixing member is able to be firmly fixed to the fixing hole.

Alternatively, the metal fixing member may be fixed to the fixing hole by press-fitting the tip of the metal fixing member to the fixing hole. Also in this case, the metal fixing member may be firmly fixed to the fixing hole.

A flat cable including the signal line and the ground line may be connected at the top surface of the interposer. For example, two flat cables may be connected to the top surface of the interposer. Alternatively, three or more flat cables may be connected to the top surface of the interposer.

It is preferable that a plurality of through-holes are provided in the element body of the interposer and the interposer is mounted at the case or the circuit substrate by a plurality of metal fixing member. In this case, a problem of a mounted interposer rotating around the metal fixing member (through-hole) is able to be avoided.

With interposers according to preferred embodiments of the present invention, a ground line may be easily connected (grounded) to a case made of metal or to a ground electrode or the like of the circuit substrate.

Furthermore, with the use of an interposer according to a preferred embodiment of the present invention, an electronic component may be mounted at the circuit substrate, and external elements may be arranged in a space above the mounted electronic component. For example, a flat cable may be wired in a space above the electronic component.

Electronic apparatuses according to preferred embodiments of the present invention each include an interposer according to a preferred embodiment of the present invention. Therefore, the ground potential of the ground line is stable.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10A is a principal part exploded perspective view illustrating an electronic apparatus 1100 disclosed in WO 2016/088592 A1, and FIG. 10B is a principal portion cross-sectional view illustrating the electronic apparatus 1100.

DETAILED DESCRIPTION OF THE PREFERRED EMBODIMENTS

Figure 1A:
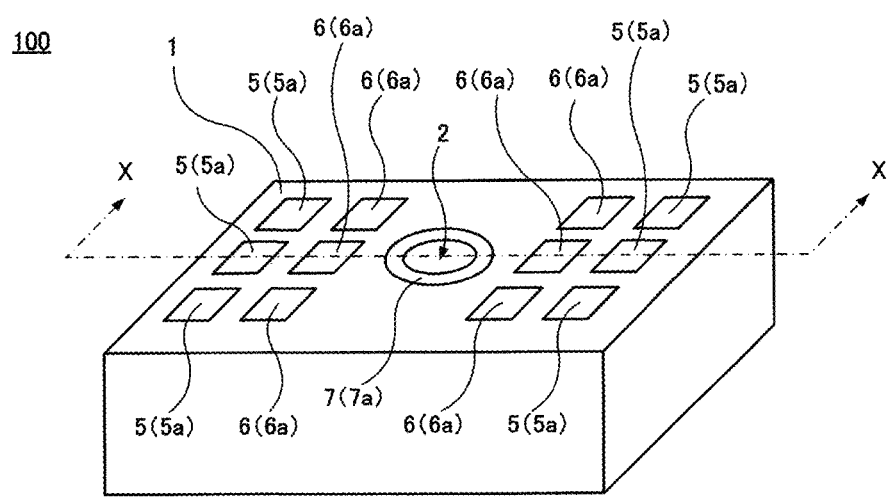
FIG. 1A is a perspective view illustrating an interposer 100 according to a first preferred embodiment.

Hereinafter, preferred embodiments of the present invention will be described with reference to drawings.

Each preferred embodiment is provided to describe a preferred embodiment of the present invention in an illustrative manner, and the present invention is not intended to be limited to details of the preferred embodiments. Furthermore, details described in different preferred embodiments may be combined together, and the combined preferred embodiments are also included in the present invention. Furthermore, the drawings are provided to facilitate understanding of preferred embodiments and may not be strictly rendered. For example, ratios of dimensions of components and ratios of dimensions between components may not be the same as those described in the description. Furthermore, components described in the description may be omitted in the drawings or the number of components may be reduced in the drawings.

First Preferred Embodiment

Figure 1B:
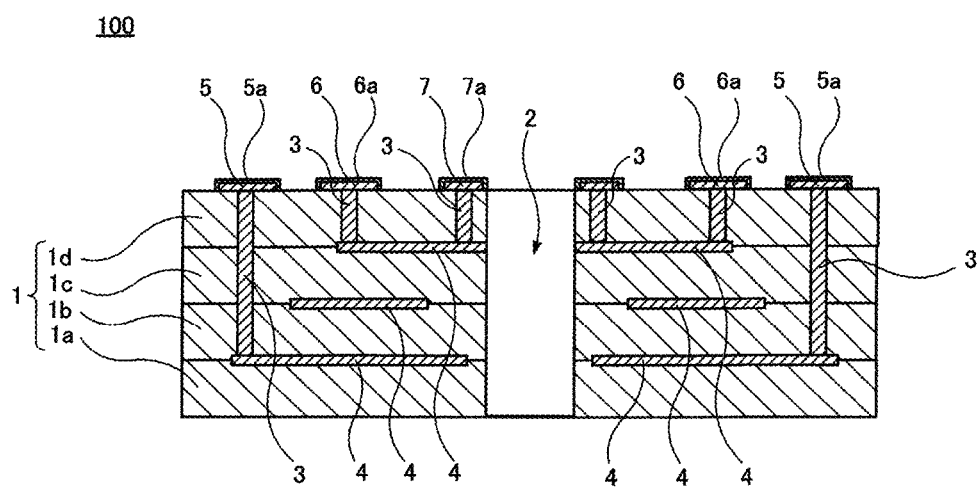
FIG. 1B is a cross-sectional view illustrating the interposer 100, where a portion taken along a one-dotted chain line X-X of FIG. 1A is illustrated.
Figure 2:
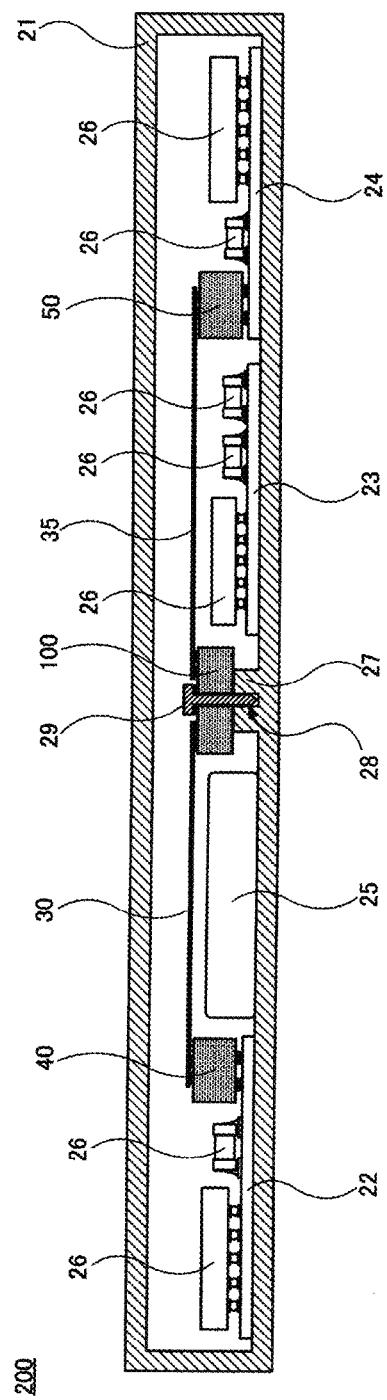
FIG. 2 is a cross-sectional view illustrating an electronic apparatus 200 according to the first preferred embodiment of the present invention.
Figure 3:
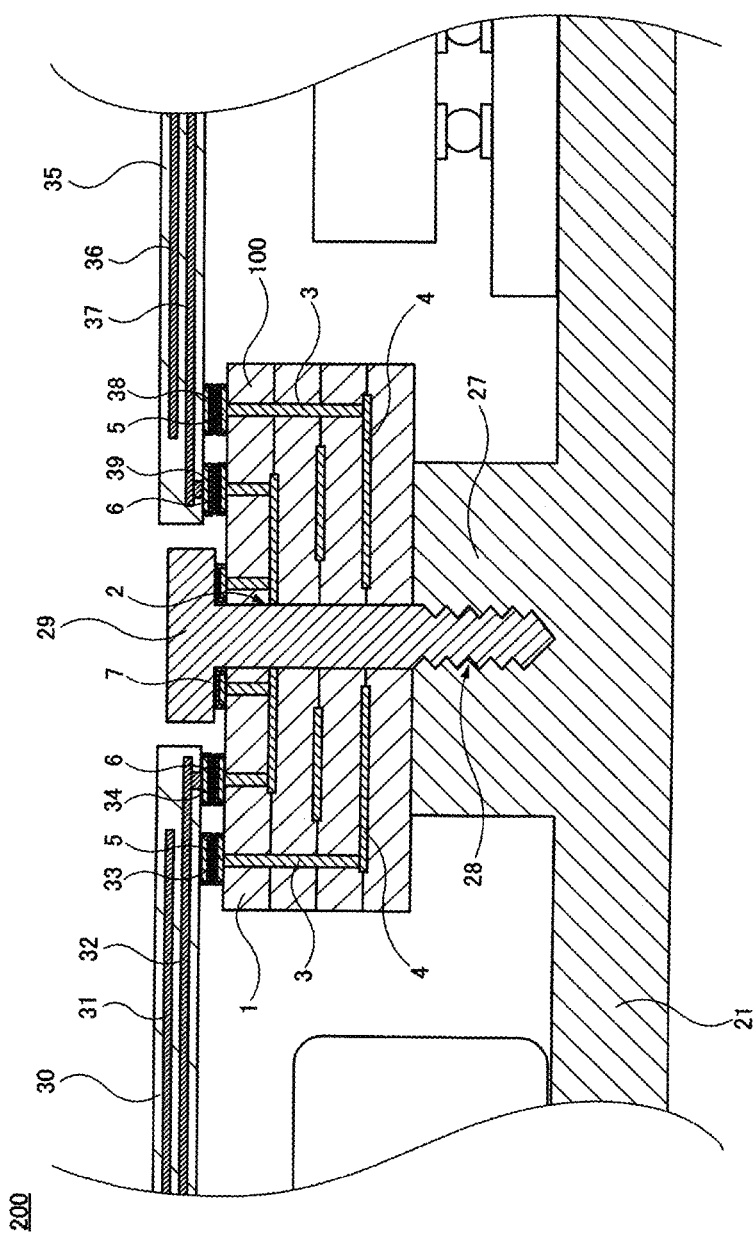
FIG. 3 is a principal portion cross-sectional view illustrating the electronic apparatus 200.

FIGS. 1A and 1B illustrate an interposer 100 according to a first preferred embodiment of the present invention. Furthermore, FIGS. 2 and 3 illustrate an electronic apparatus 200 according to the first preferred embodiment manufactured including the interposer 100. FIG. 1A is a perspective view illustrating the interposer 100. FIG. 1B is a cross-sectional view illustrating the interposer 100, where a portion taken along a one-dotted chain line X-X of FIG. 1A is illustrated. FIG. 2 is a cross-sectional view illustrating the electronic apparatus 200. FIG. 3 is a principal portion cross-sectional view illustrating the electronic apparatus 200.

The interposer 100 according to the first preferred embodiment includes an element body 1 preferably having a rectangular or substantially rectangular parallelepiped shape. The element body 1 includes four insulating layers 1a to 1d that are laminated. For example, the element body 1 (insulating layers 1a to 1c) is preferably made of ceramics, such as LTCC (Low Temperature Co-fired Ceramics; low temperature co-fired ceramics).

The element body 1 is a rectangular or substantially rectangular parallelepiped and includes a top surface, a bottom surface, and four side surfaces.

A through-hole 2 penetrates through the top surface and bottom surface of the element body 1. The through-hole 2 is provided so that a bar-shaped metal fixing member is inserted in the through-hole 2.

Via-hole conductors 3 penetrate through the insulating layers 1b to 1d. Furthermore, as needed, line conductors 4 are provided between the insulating layers 1a to 1d. Wiring electrodes, which are defined the via-hole conductors 3 and the line conductors 4, are provided inside the element body 1. For example, each of the via-hole conductors 3 and the line conductors 4 is preferably made of, for example, metal containing silver or copper as a main component.

Signal terminal electrodes 5 and ground terminal electrodes 6 are provided at the top surface of the element body 1. The signal terminal electrodes 5 are connected to a signal line at an external connecting element, such as a flat cable, for example, and the ground terminal electrodes 6 are connected to a ground line at an external connecting element, such as a flat cable, for example. In the present preferred embodiment, two sets of the signal terminal electrodes 5 and the ground terminal electrodes 6, each of the two set including three signal terminal electrodes 5 and three ground terminal electrodes 6, are provided at the top surface of the element body 1, such that two flat cables are able to be connected to the signal terminal electrodes 5 and the ground terminal electrodes 6. For example, the signal terminal electrodes 5 and the ground terminal electrodes 6 are preferably made of metal containing silver or copper as a main component.

Furthermore, a metal fixing member connecting electrode 7 having a ring shape is provided at the top surface of the element body 1 and around the cavity of the through-hole 2. The metal fixing member connecting electrode 7 achieves electrical connection with a metal fixing member inserted in the through-hole 2. For example, the metal fixing member connecting electrode 7 is preferably made of metal containing silver or copper as a main component.

Plated layers 5a are provided on the surfaces of the signal terminal electrodes 5, plated layers 6a are provided on the surfaces of the ground terminal electrodes 6, and a plated layer 7a is provided on the surface of the metal fixing member connecting electrode 7. Regarding the plated layers 5a, 6a, and 7a, for example, first layers are preferably made of nickel, and second layers are preferably made of one of metals selected from among gold, copper, and tin. However, the plated layers may have a single-layer structure instead of a multiplayer structure. Furthermore, the plated layers may be made of desired materials. The plated layers may be made of other types of metal.

Predetermined signal terminal electrodes 5 are electrically connected by wiring electrodes defined by the via-hole conductors 3 and the line conductors 4. Furthermore, the ground terminal electrodes 6 and the metal fixing member connecting electrode 7 are electrically connected by wiring electrodes defined by the via-hole conductors 3 and the line conductors 4.

A non-limiting example of a method for manufacturing the interposer 100 will now be described.

First, ceramic green sheets from which the insulating layers 1a to 1d are to be made are prepared. The green sheets are prepared as mother green sheets in which a large number of interposers are arranged in a matrix shape so that a large number of interposers 100 may be collectively manufactured.

Holes in which the via-hole conductors 3 are to be formed are formed in a predetermined mother green sheet. The holes are formed by, for example, application of laser light.

Next, conductive paste is filled in the holes formed in the mother green sheet. Then, conductive paste is printed on one main surface or both main surfaces of a predetermined mother green sheet, so that conductive paste patterns from which the line conductors 4, the signal terminal electrodes 5, the ground terminal electrodes 6, and the metal fixing member connecting electrode 7 are to be formed may be formed.

Next, a mother green sheet from which the insulating layer 1a is to be made, a mother green sheet from which the insulating layer 1b is to be made, a mother green sheet from which the insulating layer 1c is to be made, and a mother green sheet from which the insulating layer 1d is to be made are laminated in order, and are pressurized to be integrated together, so that an unfired mother element body is manufactured.

Next, the through-hole 2 is formed in a predetermined portion between the top surface and bottom surface of the unfired mother element body. The through-hole 2 is formed by, for example, application of laser light. The through-hole 2 may be formed, at the stage of mother green sheets, by forming holes in advance in the individual mother green sheets, instead of being formed in the unfired mother element body. Alternatively, the through-hole 2 may be formed in the element body 1, which has been subjected to firing, as described below, instead of being formed in the unfired mother element body.

Next, the unfired mother element body is divided into separate unfired element bodies. The division may be performed by reducing a division line using a dicing device, for example. The divided unfired element bodies each has a rectangular or substantially rectangular parallelepiped shape including a top surface, a bottom surface, and four side surfaces.

Next, the unfired element body is barrel-polished, as needed.

Next, the unfired element body is fired at a predetermined profile to produce the element body 1. The signal terminal electrodes 5, the ground terminal electrodes 6, and the metal fixing member connecting electrode 7 are provided on the top surface of the element body 1.

Next, the plated layers 5a, the plated layers 6a, and the plated layer 7a are formed on the surfaces of the signal terminal electrodes 5, the surfaces of the ground terminal electrodes 6, and the surface of the metal fixing member connecting electrode 7, respectively, for example, by electroplating, and the interposer 100 is thus completed.

The electronic apparatus 200 according to the first preferred embodiment illustrated in FIGS. 2 and 3 includes the interposer 100. The electronic apparatus 200 is preferably, for example, a portable electronic apparatus, such as a smartphone. FIG. 2 is a cross-sectional view of the electronic apparatus 200. FIG. 3 is a principal portion cross-sectional view of the electronic apparatus 200. In FIG. 2, allocation of reference signs to some components may be omitted.

The electronic apparatus 200 includes a case 21. The case 21 is made of metal.

A first circuit substrate 22, a battery pack 25, a second circuit substrate 23, and a third circuit substrate 24 are accommodated in this order inside the case 21.

Electronic components 26, such as a semiconductor device, a capacitor, a resistor, and an inductor are mounted at each of the first circuit substrate 22, the second circuit substrate 23, and the third circuit substrate 23. The electronic components 26 are mounted by bonding mounting electrodes provided on main surfaces of the circuit substrates 22 to 24 with terminal electrodes of the electronic components 26 by soldering or conductive bonding materials, such as conductive adhesives, for example.

An interposer 40 is mounted on the first circuit substrate 22. The interposer 40 is mounted by bonding a mounting electrode provided on the main surface of the circuit substrate 22 with a mounting terminal electrode provided on the bottom surface of the interposer 40 by soldering or a conductive bonding material, such as a conductive adhesive, for example.

An interposer 50 is mounted on the third circuit substrate 24. The interposer 50 is mounted by bonding a mounting electrode provided on the main surface of the circuit substrate 24 with a mounting terminal electrode provided on the bottom surface of the interposer 50 by soldering or a conductive bonding material, such as a conductive adhesive, for example.

A projecting portion 27 is provided at an inner wall of the case 21 between the battery pack 25 and the second circuit substrate 23. A fixing hole 28 is provided at the projecting portion 27. Furthermore, thread grooves are provided at the inner wall of the fixing hole 28.

The interposer 100 according to the first preferred embodiment described above is fixed to the case 21 by a bar-shaped metal fixing member 29. The metal fixing member 29 is preferably a screw including one end that includes thread ridges and whose other end that includes a head. Specifically, the metal fixing member 29 is inserted into the through-hole 2 provided at the element body 1 of the interposer 100 from the one end side (side on which the thread ridges are provided), and the thread ridges of the metal fixing member 29 are engaged with the thread grooves provided at the inner wall of the fixing hole 28, so that the interposer 100 is able to be fastened by the head portion of the metal fixing member 29, and the interposer 100 is thus fixed to the projecting portion 27 provided at the case 21.

By fixing the interposer 100 to the case 21 as described above, the metal fixing member connecting electrode 7 provided at the element body 1 of the interposer 100 is electrically connected to the head of the metal fixing member 29, and the tip of the metal fixing member 29 is electrically connected to the case 21. That is, the ground terminal electrodes 6 of the interposer 100 are connected (grounded) to the case 21 made of metal with the metal fixing member 29 interposed therebetween.

The interposer 40 mounted at the first circuit substrate 22 and the interposer 100 fixed to the case 21 are electrically connected by a flat cable 30. The flat cable 30 includes a signal line 31 and a ground line 32. Signal terminal electrodes 33 are provided at both ends of the signal line 31. Ground terminal electrodes 34 are provided at both ends of the ground line 32. One of the signal terminal electrodes 33 and the other one of the signal terminal electrodes 33 are bonded to a signal terminal provided on the top surface of the interposer 40 and the signal terminal electrode 5 provided on the top surface of the interposer 100 (element body 1), respectively, by soldering or conductive bonding materials, such as conductive adhesives, for example. Furthermore, one of the ground terminal electrodes 34 and the other one of the ground terminal electrodes 34 are bonded to a ground terminal electrode provided on the top surface of the interposer 40 and the ground terminal electrode 6 provided on the top surface of the interposer 100 (element body 1), respectively, by soldering or conductive boning materials such as conductive adhesives, for example.

The interposer 100 fixed to the case 21 and the interposer 50 mounted at the third circuit substrate 24 are electrically connected by a flat cable 35. The flat cable 35 includes a signal line 36 and a ground line 37. Signal terminal electrodes 38 are provided at both ends of the signal line 36. Ground terminal electrodes 39 are provided at both ends of the ground line 37. One of the signal terminal electrodes 38 and the other one of the signal terminal electrodes 38 are bonded to the signal terminal electrode 5 provided on the top surface of the interposer 100 (element body 1) and a signal terminal electrode provided on the top surface of the interposer 50, respectively, by soldering or conductive bonding materials such as conductive adhesives, for example. One of the ground terminal electrodes 39 and the other one of the ground terminal electrodes 39 are connected to the ground terminal electrode 6 provided on the top surface of the interposer 100 (element body 1) and a ground terminal electrode provided on the top surface of the interposer 50, respectively, by soldering or conductive bonding materials such as conductive adhesives, for example.

In the electronic apparatus 200, the signal line 31 of the flat cable 30 and the signal line 36 of the flat cable 35 are electrically connected with the interposer 100 interposed therebetween. Specifically, the signal line 31 of the flat cable 30 and the signal line 36 of the flat cable 35 are electrically connected by a path that allows connection among the signal terminal electrode 33 of the flat cable 30, a signal terminal electrode 5 of the interposer 100, internal wiring including the via-hole conductors 3 and the line conductors 4, another signal terminal electrode 5, and the signal terminal electrode 38 of the flat cable 35.

Furthermore, in the electronic apparatus 200, the ground line 32 of the flat cable 30 and the ground line 37 of the flat cable 35 are electrically connected to the case 21, which is made of metal, with the interposer 100 interposed therebetween. Specifically, the ground line 32 of the flat cable 30 is electrically connected to the case 21, which is made of metal, by a path that allows connection among the ground terminal electrode 34 of the flat cable 30, the ground terminal electrode 6 of the interposer 100, internal wiring including the via-hole conductors 3 and the line conductors 4, the metal fixing member connecting electrode 7, and the metal fixing member 29. In a similar manner, the ground line 37 of the flat cable 35 is electrically connected to the case 21, which is made of metal, by a path that allows connection among the ground terminal electrode 39 of the flat cable 35, the ground terminal electrode 6 of the interposer 100, internal wiring including the via-hole conductors 3 and the line conductors 4, the metal fixing member connecting electrode 7, and the metal fixing member 29.

In the case where the interposer 40 mounted at the first circuit substrate 22 and the interposer 50 mounted at the third circuit substrate 24, the interposer 40 and the interposer 50 being spaced away from each other, are electrically connected by a single flat cable, the ground potential of the ground line of the flat cable may be unstable at an intermediate portion between the interposer 40 and the interposer 50. When the ground potential of the ground line is unstable, external noise may be superimposed on a signal flowing in a signal line of the flat cable and the insertion loss of the signal line may thus be increased.

In contrast, in the electronic apparatus 200 according to the present preferred embodiment, each of the ground line 32 of the flat cable 30 and the ground line 37 of the flat cable 35 is electrically connected (grounded) to the case 21, which is made of metal, with the interposer 100 interposed therebetween. Therefore, the ground potentials of the ground lines 32 and 37 are not unstable at an intermediate portion therebetween. Thus, in the electronic apparatus 200, external noise is not superimposed on signals flowing in the signal lines 31 and 36 of the flat cables 30 and 35, respectively, and the insertion loss of the signal lines 31 and 36 is thus not increased.

Second Preferred Embodiment

Figure 4:
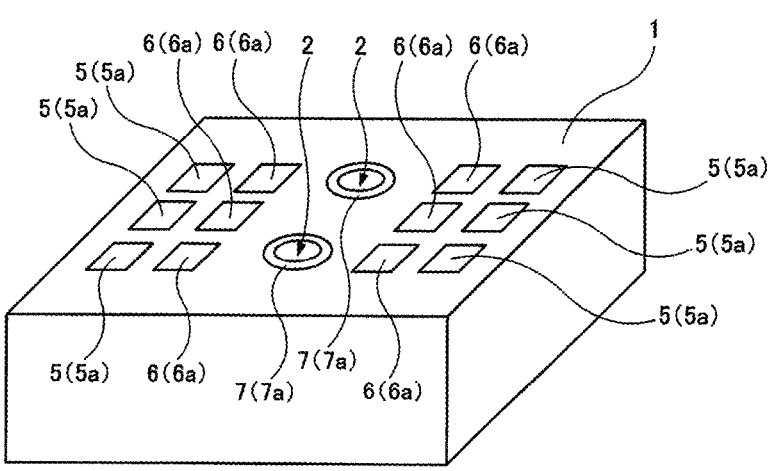
FIG. 4 is a perspective view illustrating an interposer 300 according to a second preferred embodiment of the present invention.

FIG. 4 illustrates an interposer 300 according to a second preferred embodiment of the present invention. FIG. 4 is a perspective view of the interposer 300.

The interposer 300 has a configuration partially different from the interposer 100 according to the first preferred embodiment.

In the interposer 100, a single through-hole 2 is provided in the element body 1. In contrast, in the interposer 300, two through-holes 2 are provided in the element body 1. The metal fixing member connecting electrode 7 is provided around each of the through-holes 2.

The remaining configuration of the interposer 300 is the same or substantially the same as that of the interposer 100.

The interposer 300 is used in a state in which the interposer 300 is fixed to a case made of metal or the like by two metal fixing members.

The interposer 300 is fixed by the two metal fixing members. Therefore, a problem of the mounted interposer 300 rotating around a metal fixing member (through-hole 2) does not occur. The number of the through-holes 2 may be three or more.

Third Preferred Embodiment

Figure 5A:
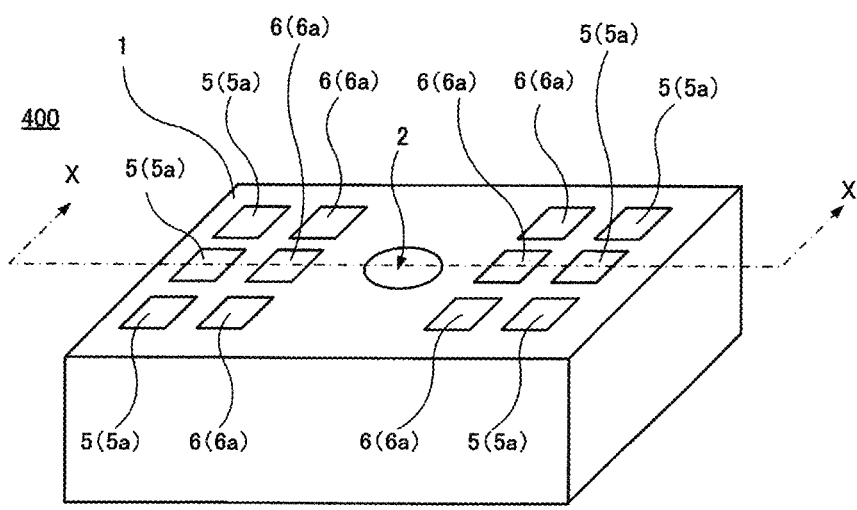
FIG. 5A is a perspective view illustrating an interposer 400 according to a third preferred embodiment of the present invention.
Figure 5B:
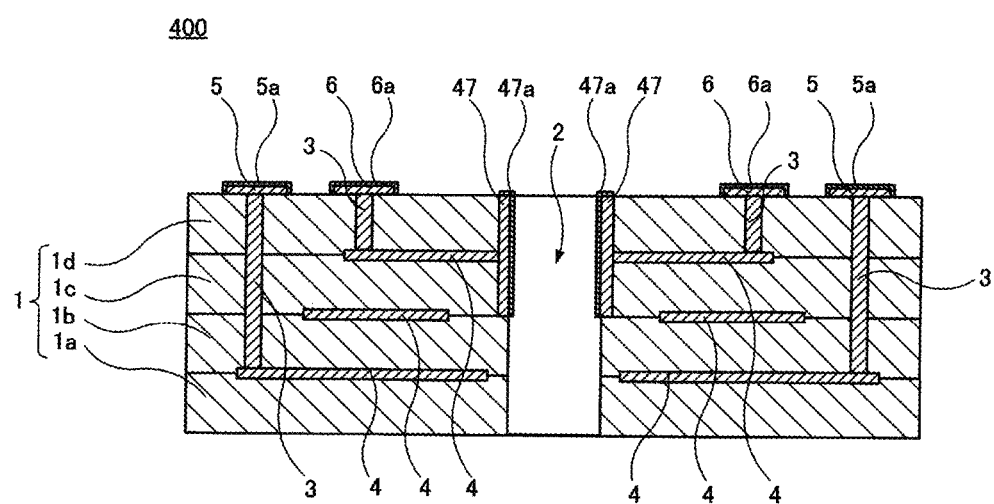
FIG. 5B is a cross-sectional view illustrating the interposer 400, where a portion taken along a one-dotted chain line X-X of FIG. 5A is illustrated.

FIGS. 5A and 5B illustrate an interposer 400 according to a third preferred embodiment of the present invention. FIG.

5A is a perspective view of the interposer 400. FIG. 5B is a cross-sectional view of the interposer 400, where a portion along a one-dotted chain line X-X of FIG. 5A is illustrated.

The interposer 400 also has a configuration partially different from that of the interposer 100 according to the first preferred embodiment.

In the interposer 100, the metal fixing member connecting electrode 7 having the ring shape is provided on the top surface of the element body 1 and around the cavity of the through-hole 2. In contrast, in the interposer 400, a metal fixing member connecting electrode 47 is provided at the inner wall of the through-hole 2. In addition, a plated layer 47a is provided on the surface of metal fixing member connecting electrode 47.

The metal fixing member connecting electrode 47 is electrically connected, by wiring electrodes including the via-hole conductors 3 and the line conductors 4, to the ground terminal electrodes 6 provided on the top surface of the element body 1.

When a metal fixing member is inserted in the through-hole 2, the metal fixing member connecting electrode 47 is electrically connected to the metal fixing member.

Divided cross sections of via-hole conductors, which appear at the inner wall of the through-hole 2 when the through-hole 2 is provided, may be used as the metal fixing member connecting electrode 47.

The remaining configuration of the interposer 400 is the same or substantially the same as that of the interposer 100.

Both of the metal fixing member connecting electrode 47 and the metal fixing member connecting electrode 7 provided on the top surface of the element body 1 of the interposer 100 according to the first preferred embodiment may be provided.

Fourth Preferred Embodiment

Figure 6A:
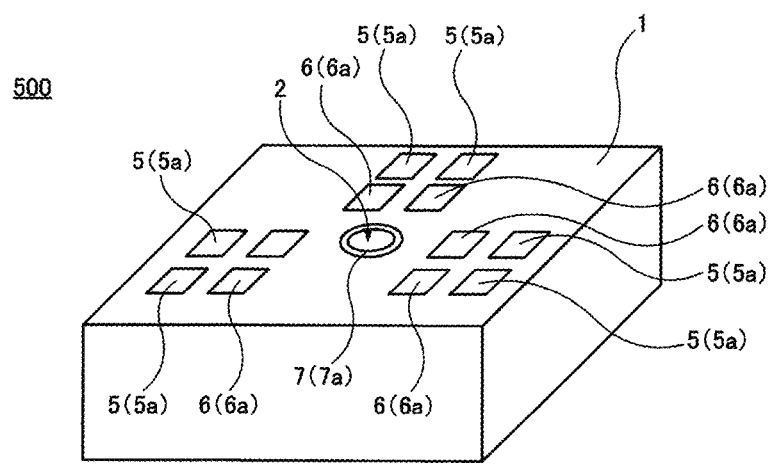
FIG. 6A is a perspective view illustrating an interposer 500 according to a fourth preferred embodiment of the present invention.
Figure 6B:
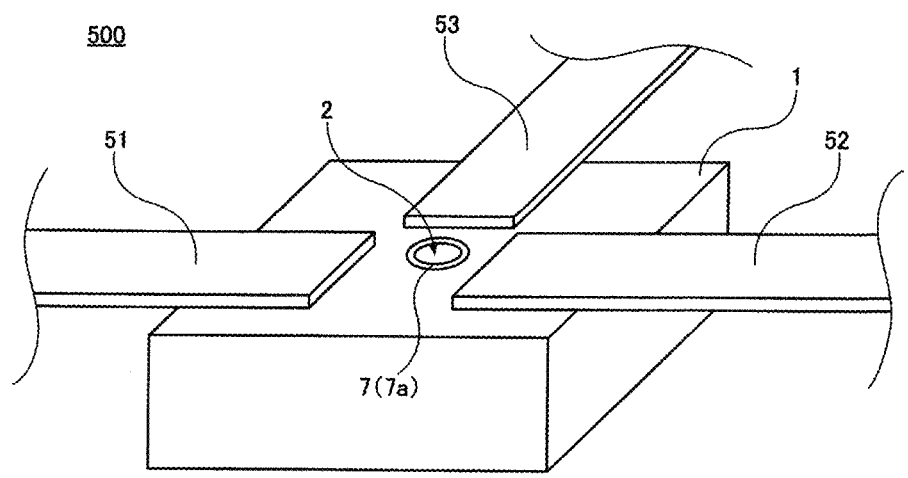
FIG. 6B is a perspective view illustrating a state in which flat cables 51 to 53 are connected to the interposer 500.

FIGS. 6A and 6B illustrate an interposer 500 according to a fourth preferred embodiment of the present invention. FIG. 6A is a perspective view of the interposer 500. FIG. 6B is a perspective view illustrating a state in which three flat cables 51 to 53 are connected to the interposer 500.

The interposer 500 also has a configuration partially different from that of the interposer 100 according to the first preferred embodiment.

In the interposer 100, two sets of the signal terminal electrodes 5 and the ground terminal electrodes 6, each of the two sets including three signal terminal electrodes 5 and three ground terminal electrodes 6, are provided on the top surface of the element body 1 such that two flat cables are able to be connected to the signal terminal electrodes 5 and the ground terminal electrodes 6. In contrast, in the interposer 500, three sets of the signal terminal electrodes 5 and the ground terminal electrodes 6, each of the three sets including two signal terminal electrodes 5 and two ground terminal electrodes 6, are provided on the top surface of the element body 1 such that three flat cables are able to be connected to the signal terminal electrodes 5 and the ground terminal electrodes 6.

Predetermined signal terminal electrodes 5 are electrically connected by wiring electrodes including the via-hole conductors 3 and the line conductors 4. Furthermore, each of the ground terminal electrodes 6 is electrically connected to the metal fixing member connecting electrode 7 by wiring electrodes including the via-hole conductors 3 and the line conductors 4.

The remaining configuration of the interposer 500 is the same or substantially the same as that of the interposer 100.

FIG. 6B illustrates a state in which the three flat cables 51 to 53 are connected to the interposer 500. The signal terminal electrodes 5 and the ground terminal electrodes 6 may be provided on the top surface of the element body 1 such that four or more flat cables may be connected to the signal terminal electrodes 5 and the ground terminal electrodes 6.

Fifth Preferred Embodiment

Figure 7:
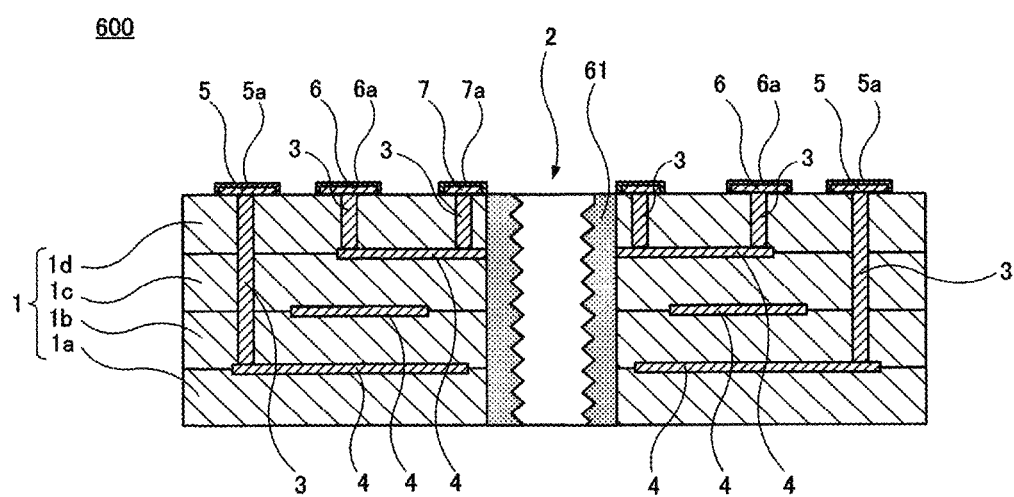
FIG. 7 is a cross-sectional view illustrating an interposer 600 according to a fifth preferred embodiment of the present invention.

FIG. 7 illustrates an interposer 600 according to a fifth preferred embodiment of the present invention. FIG. 7 is a cross-sectional view of the interposer 600.

The interposer 600 includes a feature added to that of the interposer 100 according to the first preferred embodiment.

In the interposer 600, a conductive resin 61 is filled in the through-hole 2 provided in the element body 1, a through-hole is provided in the filled conductive resin 61, and thread grooves are provided at the inner wall of the formed through-hole. The conductive resin 61 is electrically connected to the ground terminal electrodes 6 by wiring electrodes including the via-hole conductors 3 and the line conductors 4.

The remaining configuration of the interposer 600 is the same or substantially the same as that of the interposer 100.

A metal fixing member (screw) including thread ridges provided from the tip to the head thereof is used for the interposer 600.

In the interposer 600, the thread grooves provided at the inner wall of the through-hole provided in the conductive resin 61 and the thread ridges of the metal fixing member are engaged with each other. Therefore, the metal fixing member may be firmly fixed to the interposer 600. Furthermore, an excellent electrical connection is able to be achieved between the conductive resin 61 and the metal fixing member.

Sixth Preferred Embodiment

Figure 8:
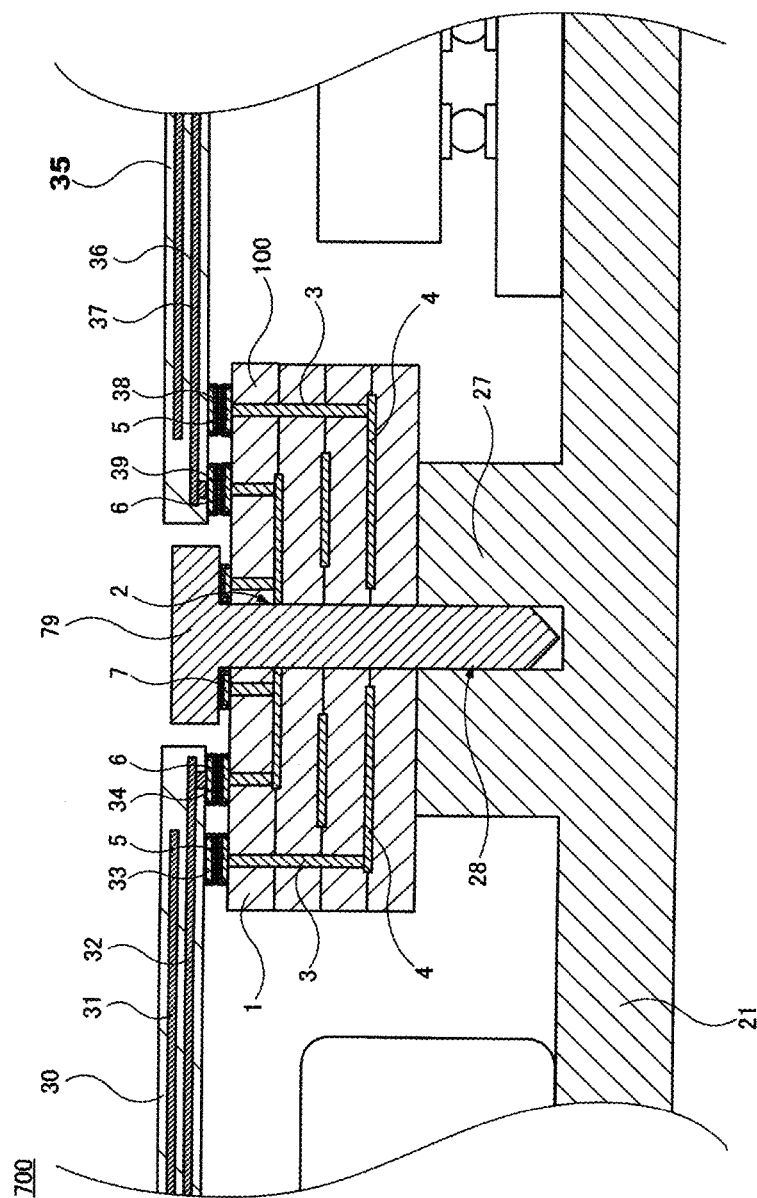
FIG. 8 is a cross-sectional view illustrating an interposer 700 according to a sixth preferred embodiment of the present invention.

FIG. 8 illustrates an electronic apparatus 700 according to the sixth preferred embodiment of the present invention. FIG. 8 is a cross-sectional view of the electronic apparatus 700.

The electronic apparatus 700 has a configuration partially different from the electronic apparatus 200 according to the first preferred embodiment.

In the electronic apparatus 200, thread grooves are provided at the inner wall of the fixing hole 28. Furthermore, thread ridges are provided at the tip of the metal fixing member 29. In contrast, in the electronic apparatus 200, thread grooves are not provided at the inner wall of the fixing hole 28. Furthermore, a metal fixing member 79 to fix the interposer 100 is a bar-shaped member in which no thread ridges are provided. A head is provided at the other end of the metal fixing member 79.

In the electronic apparatus 700, the metal fixing member 79 is inserted in the through-hole 2 provided in the element body 1 of the interposer 100, and the tip of the metal fixing member 79 is press-fit into the fixing hole 28. Therefore, the interposer 100 is fastened by the head of the metal fixing member 79, and the interposer 100 is thus fixed to the projecting portion 27 provided at the case 21.

The remaining configuration of the electronic apparatus 700 is the same or substantially the same as that of the electronic apparatus 200.

Seventh Preferred Embodiment

Figure 9:
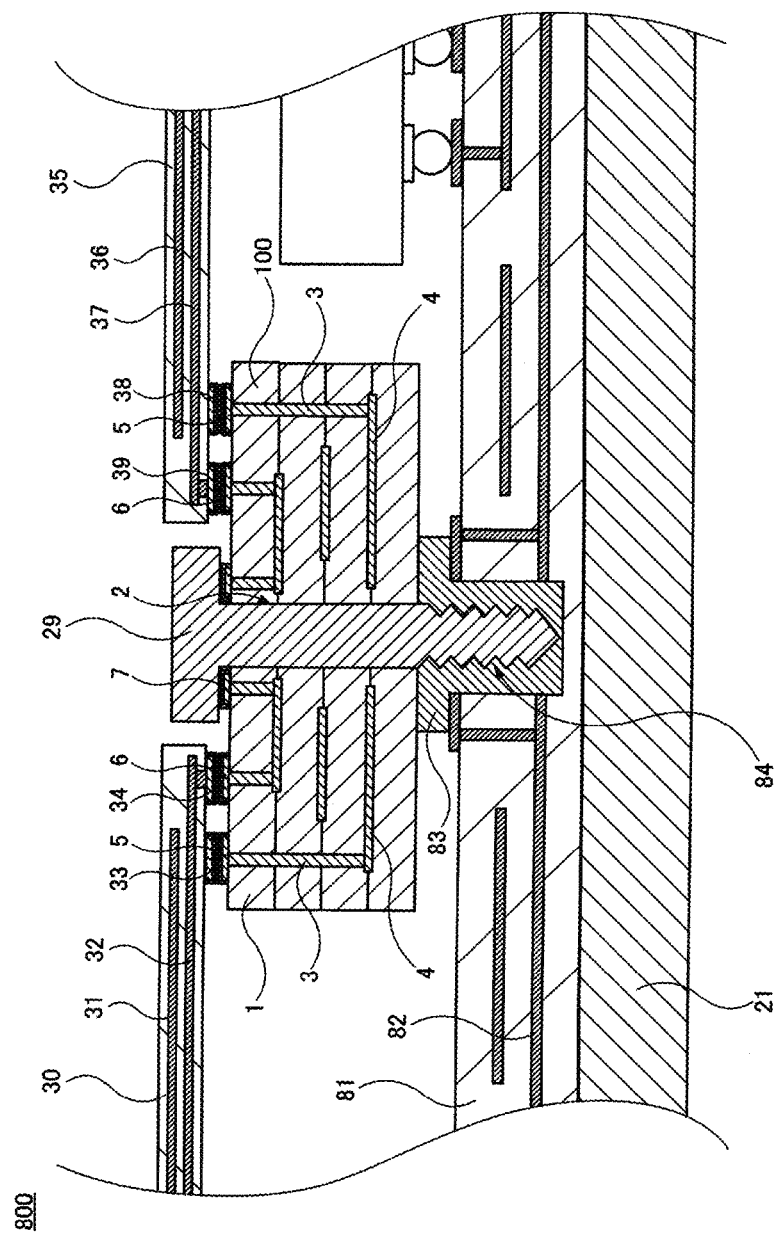
FIG. 9 is a cross-sectional view illustrating an electronic apparatus 800 according to a seventh preferred embodiment of the present invention.

FIG. 9 illustrates an electronic apparatus 800 according to a seventh preferred embodiment of the present invention. FIG. 9 is a cross-sectional view of the electronic apparatus 800.

The electronic apparatus 800 also has a configuration partially different from that of the electronic apparatus 200 according to the first preferred embodiment.

In the electronic apparatus 200, the projecting portion 27 is provided at the inner wall of the case 21 made of metal, and the interposer 100 is fixed to the projecting portion 27. In the electronic apparatus 800, in place of the projecting portion 27, a circuit substrate (PCB (printed circuit board)) 81 is provided inside the case 21, and the interposer 100 is mounted at the circuit substrate 81.

The circuit substrate 81 is preferably a multilayer substrate and includes a large and stable ground electrode 82 therein. A metal member 83 is mounted on the upper main surface of the circuit substrate 81. The metal member 83 is electrically connected to the ground electrode 82. A fixing hole 84 is provided in the metal member 83, and thread grooves are provided at the inner wall of the fixing hole 84.

In the electronic apparatus 800, the metal fixing member 29 is inserted in the through-hole 2 provided in the element body 1 of the interposer 100, and the thread ridges provided at the tip of the metal fixing member 29 are engaged with the thread grooves provided at the inner wall of the fixing hole 84. Accordingly, the interposer 100 is mounted at the circuit substrate 81.

The remaining configuration of the electronic apparatus 800 is the same or substantially the same as that of the electronic apparatus 200.

As described above, the interposer 100 may be mounted at the circuit substrate 81, instead of the case 21 made of metal.

The interposer 100 and the electronic apparatus 200 according to the first preferred embodiment, the interposers 300, 400, 500, and 600 according to the second to fifth preferred embodiments, and the electronic apparatuses 700 and 800 according to the sixth and seventh preferred embodiments have been described above. However, the present invention is not limited to those described above, and various changes may be made to the present invention in accordance with the spirit and scope of the present invention.

For example, in each of the interposers 100, 300, 400, 500, and 600, the element body 1 is preferably a multilayer element body in which the insulating layers 1a to 1d made of ceramics or the like are laminated. However, the element body of the interposer is not necessarily a multilayer element body and may be a block element body including one block. Furthermore, the element body may be made of desired materials. The element body may be made of resin, instead of ceramics, for example.

Furthermore, in each of the interposers 100, 300, 400, 500, and 600, the numbers, shapes, locations, and the like of the signal terminal electrodes 5, the ground terminal electrodes 6, and the metal fixing member connecting electrodes 7 and 47, which are provided in the element body 1, may be set in a desired manner and are not limited to those described above.

Furthermore, for ease of understanding, in FIGS. 2, 3, 8, and 9 illustrating the electronic apparatuses 200, 700, and 800, dimensions of the interposer 100 are larger than those of the other components. However, the interposer 100 may be manufactured with very small dimensions by using a multilayer ceramic technology used to manufacture multilayer ceramics electronic components (multilayer ceramic capacitors and the like).

Furthermore, each of the electronic apparatuses 200, 700, and 800 is a portable electronic apparatus, such as a smartphone, for example. However, the electronic apparatus may be of a desired type and may be of a different type.

Furthermore, in each of the electronic apparatuses 200 and 700, the projecting portion 27 is provided at the case 21 made of metal, and the fixing hole 28 is provided in the projecting portion 27. However, the projecting portion 27 is not necessarily provided. The projecting portion 27 may be omitted, and the fixing hole 28 may be provided directly in the inner wall of the case 21.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic apparatus comprising:
a case;
a circuit substrate, a first electronic component, and a second electronic component accommodated in the case;
a first signal line and a first ground line;
a second signal line and a second ground line;
an interposer including an insulating element body including a bottom surface, a top surface, and a plurality of side surfaces connecting the bottom surface with the top surface, a wiring electrode provided inside the element body, and a first terminal electrode and a second terminal electrode provided at the top surface of the element body, wherein the first terminal electrode includes a first signal terminal electrode connected to the first signal line and a first ground terminal electrode connected to the first ground line, the second terminal electrode includes a second signal terminal electrode connected to the second signal line and a second ground terminal electrode connected to the second ground line, a through-hole penetrates through the bottom surface and the top surface of the element body, a metal fixing member connecting electrode is provided at the top surface of the element body or an inner wall of the through-hole, the first signal terminal electrode and the second signal terminal electrode are electrically connected by the wiring electrode, and the first ground terminal electrode, the second ground terminal electrode, and the metal fixing member connecting electrode are electrically connected; and
a bar-shaped metal fixing member; wherein
a fixing hole to fix the metal fixing member is provided in the case or the circuit substrate;
after the metal fixing member is inserted in the through-hole so that the metal fixing member is electrically connected to the metal fixing member connecting electrode, the metal fixing member is fixed to the fixing hole, and the interposer is mounted at the case or the circuit substrate;
the interposer is between the first electronic component and the second electronic component; and
the first signal line passes over the first electronic component and is electrically connected to the first signal terminal electrode of the interposer and the second signal line passes over the second electronic component and is electrically connected to the second signal terminal electrode by a conductive bonding material, and the first ground line passes over the first electronic component and is electrically connected to the first ground terminal electrode of the interposer and the second ground line passes over the second electronic component and is electrically connected to the second ground electrode.

2. The electronic apparatus according to claim 1, further comprising a first flat cable and a second flat cable, wherein the first flat cable includes the first signal line and the first ground line, and the second flat cable includes the second signal line and the second ground line.

3. The electronic apparatus according to claim 1, wherein the element body is a multilayer element body including insulating layers that are laminated.

4. The electronic apparatus according to claim 1, wherein the element body is made of resin.

5. The electronic apparatus according to claim 4, wherein conductive resin is filled in the through-hole, and thread grooves are provided in the conductive resin.

6. The electronic apparatus according to claim 1, wherein a plurality of the through-holes are provided in the element body.

7. The electronic apparatus according to claim 2, further comprising a third terminal electrode provided at the top surface of the element body, and a third flat cable connected to the third terminal electrode.

8. The electronic apparatus according to claim 1, wherein the case is made of metal;
the fixing hole is provided in the case; and
the metal fixing member is electrically connected to the case.

9. The electronic apparatus according to claim 1, wherein the circuit substrate includes a ground electrode and a metal member electrically connected to the ground electrode;
the fixing hole is provided in the metal member; and
the metal fixing member and the ground electrode are electrically connected with the metal member interposed therebetween.

10. The electronic apparatus according to claim 1, wherein a flat cable including one of the first or second signal line and one of the first or second ground line is connected to the top surface of the interposer.

11. An interposer comprising:
an insulating element body including a bottom surface, a top surface, and a plurality of side surfaces connecting the bottom surface with the top surface;
a wiring electrode provided inside the element body; and
a first terminal electrode and a second terminal electrode provided at the top surface of the element body and connected to an outside with a conductive bonding material interposed therebetween; wherein
the first terminal electrode includes a first signal terminal electrode and a first ground terminal electrode connected to a first signal line and a first ground line, respectively;
the second terminal electrode includes a second signal terminal electrode and a second ground terminal electrode connected to a second signal line and a second ground line, respectively;
a through-hole penetrating through the bottom surface and the top surface of the element body and allowing a bar-shaped metal fixing member to be inserted therein is provided;
a metal fixing member connecting electrode electrically connected to the metal fixing member is provided at at least one of the top surface of the element body and an inner wall of the through-hole; and
the first signal terminal electrode and the second signal terminal electrode are electrically connected by the wiring electrode, and the first ground terminal electrode, the second ground terminal electrode, and the metal fixing member connecting electrode are electrically connected.

12. The interposer according to claim 11, wherein the first signal line and the first ground line are included in an external first cable, and the second signal line and the second ground line are included in an external second cable.

* * * * *